US008400146B2

(12) United States Patent
Kim et al.

(10) Patent No.: US 8,400,146 B2
(45) Date of Patent: Mar. 19, 2013

(54) STRAY FIELD COLLECTOR PAD, AND BIO-MOLECULE SENSING MODULE OR BIOCHIP USING THE SAME

(75) Inventors: Cheolgi Kim, Daejeon (KR); Brajalal Sinha, Daejeon (KR); Sunjong Oh, Daejeon (KR); Jong-Ryul Jeong, Daejeon (KR)

(73) Assignee: The Industry & Academic Coorporation in Chungnam National University, Daejeon (KR)

( * ) Notice: Subject to any disclaimer, the term of this patent is extended or adjusted under 35 U.S.C. 154(b) by 328 days.

(21) Appl. No.: 12/699,383

(22) Filed: Feb. 3, 2010

(65) Prior Publication Data

US 2011/0156702 A1 Jun. 30, 2011

(30) Foreign Application Priority Data

Dec. 30, 2009 (KR) .................. 10-2009-0133930

(51) Int. Cl.
*G01R 33/02* (2006.01)
(52) U.S. Cl. ........ 324/249; 324/251; 324/252; 324/244; 360/327; 360/326

(58) Field of Classification Search .................. 324/249; 360/326, 327
See application file for complete search history.

(56) References Cited

U.S. PATENT DOCUMENTS

| 5,942,895 | A | 8/1999 | Popovic et al. | |
|---|---|---|---|---|
| 6,266,218 | B1 * | 7/2001 | Carey et al. | 360/324.12 |
| 7,145,330 | B2 * | 12/2006 | Xiao | 324/244 |
| 8,108,023 | B2 * | 1/2012 | Mir et al. | 600/347 |
| 8,242,776 | B2 * | 8/2012 | Mather et al. | 324/249 |
| 2008/0036450 | A1 * | 2/2008 | Kahlman et al. | 324/202 |

* cited by examiner

*Primary Examiner* — Richard Isla Rodas
(74) *Attorney, Agent, or Firm* — The Webb Law Firm

(57) ABSTRACT

Provided is a stray field collector (SFC) pad and a bio-molecule sensing module or a biochip using the same, and more particularly, a SFC pad, in which probe or detection molecules are attached to a plurality of magnetic labels (magnetic particles or beads) and they are bonded to complementary molecules to enhance a stray field sensor signal of the magnetic labels remaining in the vicinity of the sensor, and a bio-molecule sensing module and a biochip using the same. The provided is related to qualitative as well as quantitative detection of magnetic labels, and the SFC pad which can increase an effective surface area sensitive to the magnetic labels by probe-detection molecular bond in a magnetic biosensor and collect the resultant stray field can enhance sensitivity, accuracy and resolution of the magnetic biosensor.

6 Claims, 8 Drawing Sheets

Prior Art

STRAY FIELD COLLECTOR PAD, AND BIO-MOLECULE SENSING MODULE OR BIOCHIP USING THE SAME

CROSS-REFERENCE(S) TO RELATED APPLICATIONS

The present invention claims priority of Korean Patent Application No. 10-2009-0133930, filed on Dec. 30, 2009, which is incorporated herein by reference.

BACKGROUND OF THE INVENTION

1. Field of the Invention

The present invention relates to a stray field collector (SFC) pad and a bio-molecule sensing module using the same, and more particularly, to a SFC pad, in which probe or detection molecules are attached to a plurality of magnetic labels (magnetic particles or beads) and they are bonded to complementary molecules to enhance a stray field sensor signal of the magnetic labels remaining in the vicinity of the sensor, and a bio-molecule sensing module and a biochip using the same.

2. Description of Related Art

Since the late 1990s, a technology of a weak magnetic field sensor has become a promising technology to develop biochip sensors and biochips. As shown in FIG. 1, the basic idea behind a spintronic biosensor is to replace traditionally used fluorescent markers by magnetic labels for sensitive detection of biomolecules and measure stray fields of the magnetic labels, to thereby develop an automated signal measurement technology with enhanced resolution and sensitivity.

Here, FIG. 1 shows a conventional magnetic label and a sensing method for detecting bio-molecules using a magnetic biochip sensor, which is one of conventional technologies. The conventional configuration includes a biochip sensor 100, a glass or silicon substrate 110 on which the biochip sensor 100 is mounted, a protection layer 120 for protecting the sensor 100, and a super-paramagnetic magnetic label 130 which is laid on the protection layer 120.

When an external magnetic field $H_{app}$ is applied, the magnetic label 130 is magnetized in a direction 140, and a stray field 150 is thus induced in a direction opposite to the direction of the external field. Therefore, the total effective magnetic field in the sensor decreases.

In an array type bio-molecule sensing technology of the aforementioned magnetic biochip method, the magnetic labels are immobilized and remain on a surface of the sensor by bonding of detection and probe molecules and the magnetic sensor senses the resultant stray field.

Meanwhile, in a membrane strip bio-molecule sensing technology of the conventional magnetic biochip technologies, the magnetic labels remain within a strip by bonding of detection and probe molecules and the magnetic sensor senses the resultant stray field.

In the array type and strip method, the detection of the magnetic label (stray field) is carried out by using different types of integrated magnetic sensors, and sensitivity of the sensor decreases with increase of sensor size when the number of the remaining label is constant. The stray field by a single magnetic label and the effective magnetic field acting on the sensor can be expressed by the following equation:

$$H_{\mathit{eff}} = H_{app} - H_{stray1} \qquad \text{[Mathematical Equation 1]}$$
$$= k \frac{\chi V_{label}}{4\pi z^3} H_{app}$$

where, z is the normal distance between the center of the magnetic label and the sensor surface, $k=A_{label}/A_{sensor}$ is the active coefficient depending on the sensor area $A_{sensor}$ and the projected label area $A_{label}$, and $\chi$ and $V_{label}$ are the magnetic mass susceptibility and volume of the magnetic label respectively.

That is, the conventional technology shown in FIG. 1 measures the bio-molecule magnetic labels such as magnetic nanoparticles/beads placed in the vicinity of the sensor using the magnetic sensor 100 to detect the bio-molecules. In the array type, immobilization and hybridization for the bio-molecules are carried out on the surface of the sensor 100 and the magnetic labels remain on the surface. In the membrane strip method, the immobilization and hybridization for the bio-molecules are carried out within the strip and the magnetic labels remain within the strip. In both cases, the sensor area becomes an active region for the detection of the magnetic labels and an average of the label stray field formed over the sensor area is measured.

However, the sensitivity of the sensor 100 decreases with the increase of the sensor size when the number of the remaining magnetic labels is constant. For a small sensor of a micrometer size, there is a limitation in a dynamic range of the label detection of the sensor 100 and a resolution problem of the sensor since the active region of the label that can affect the sensor is limited to a micrometer size.

Moreover, in statistic view point of the distribution of bio-molecules, since the presence of the bio-molecules is measured and determined by the presence of the label only in the vicinity of the sensor that is very tiny as compared to the whole sample volume, the detection in the tiny region alone cannot represent the representative characteristics of the whole sample volume and accuracy/precision of the detection is consequently not reliable.

SUMMARY OF THE INVENTION

An embodiment of the present invention is directed to providing a pad that increases a label sensible active region, keeps the optimized sensor size, increases the number of magnetic labels causing stray field in the sensor and is able to collect the stray field, and a bio-molecule sensing module using the same.

Another embodiment of the present invention is directed to providing a stray field collector (SFC) pad capable of overcoming the disadvantages of the conventional art, in which a single sensor senses a label only in a tiny area and is thus not able to sense characteristics of the whole sample volume, and sensing a large number of bio-molecules in a large active region to obtain reliable data, and a bio-molecule sensing module using the same.

In one embodiment, the present invention provides a stray field collector (SFC) pad and a bio-molecule sensing module including the same. The SFC pad is formed such that it has a large sensing active region and a field collecting portion thereof is relatively narrowed in a direction of the applied magnetic field. In the vicinity of a pad surface that is an active region for the bio-molecule detection, there is a relatively large amount of magnetic labels remaining by probe-detection bio-molecular bond.

This SFC pad not only increases the number of the labels remaining in the active region but also collects the stray field generated from the labels to amplify the magnetic flux density.

Also, the pad can be made of a soft magnetic material or can be made of a soft magnetic material of a single or multilayer structure.

In another embodiment, a bio-molecule sensing module includes at least one SFC pad as described above, and a biochip sensor that is spaced from the SFC pad by a predetermined gap and senses a magnetic flux density.

This bio-molecule sensing module includes a single SFC pad type in which the SFC pad is disposed alignedly with the biochip sensor with a predetermined gap, and a dual SFC pad type in which first and second SEC pads are disposed longitudinally or laterally with a predetermined gap from the biochip sensor with the biochip sensor therebetween.

Here, the magnetic sensor can be any one of a giant magneto-resistance (GMR), an anisotropic magneto-resistance (AMR), a planar Hall resistance (PHR) in a magnetic thin film, a giant magneto-impedance (GMI) and a Hall effect sensor in a semiconductor.

Here, the amplification of the magnetic flux density depends on the gap between the SFC pad and the sensor.

Here, the SFC pad can function to collect the magnetic flux to the biochip sensor and increase the flux density of the external magnetic field applied on the biochip sensor.

The bio-molecule sensing module can be any one of a membrane strip type sensor module, an array type biosensor module and a channel type biosensor module.

When the labels are generally uniform in the active region, the stray field is expressed by the following mathematical equation:

$$B_{stray} = f(\mu) H_{stray1} N$$

$$\propto f(\mu) H_{stray1}^{A_{pad}/A_{sensor}}$$

where, $\mu$ is the permeability of the pad, and $f(\mu)$ is the amplification factor of the magnetic field, depending on the geometry and permeability of the pad, N is the number of the magnetic labels that apply the stray field on the active region of the pad, and $H_{stray1}$ is the stray field made by a single magnetic label.

In accordance with the present invention, it is possible to enhance a resolution in stray field measurement for a magnetic label attached to the probe-detection bio-molecular bond by remaining a plurality of the magnetic labels on one SFC pad.

Also, in accordance with the present invention, it is possible to obtain representative bio-molecule sensing result for whole sample volume only with one small sensor.

DETAILED DESCRIPTION OF MAIN ELEMENTS

Figure 1:
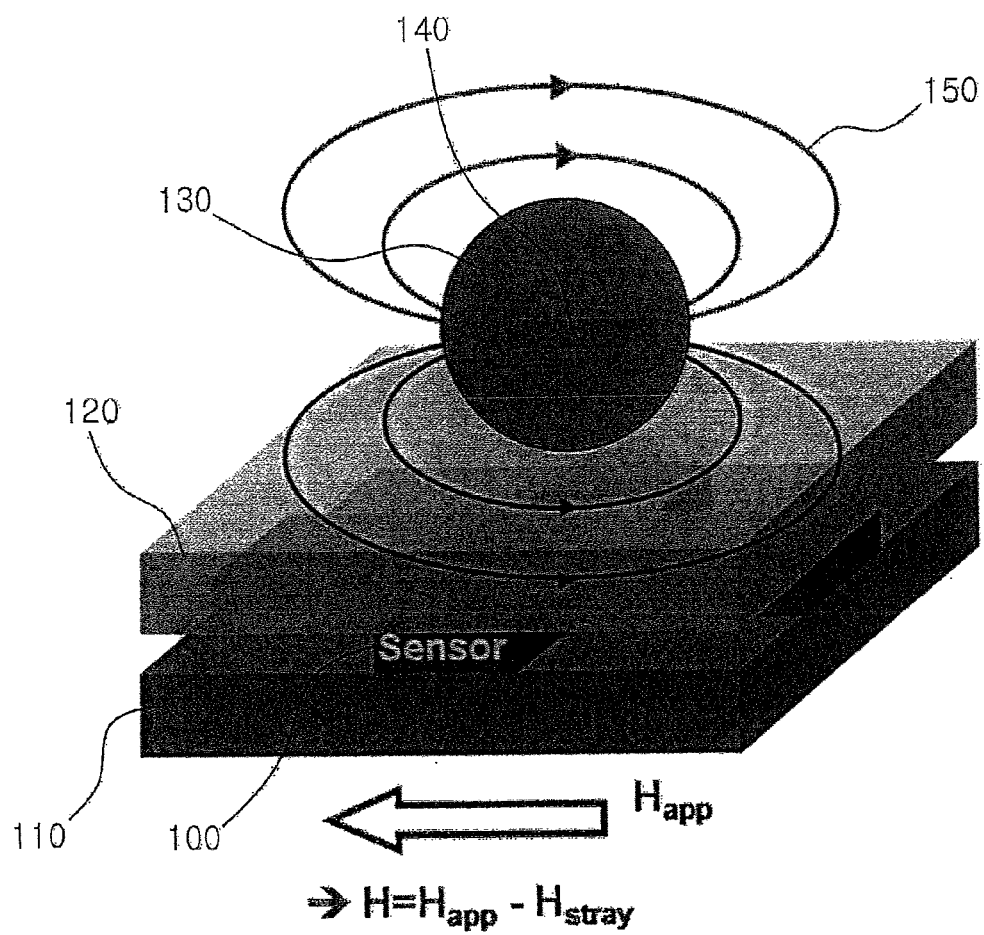
FIG. 1 shows a conventional method for detecting biomolecules using a magnetic biochip sensor.

100: biochip sensor 110: silicon substrate
120: protection layer 130, 210: magnetic label
140: magnetized direction 150: stray filed
200, 200a, 200b: SFC pad 201: plate
221: bio-molecule
220: partially enlarged sectional view
401, 501: magnetic flux lines
600: sensor signal curve without SFC pad
601: sensor signal curve with SFC pad

DESCRIPTION OF SPECIFIC EMBODIMENTS

The advantages, features and aspects of the invention will become apparent from the following description of the embodiments with reference to the accompanying drawings, which is set forth hereinafter.

First, for help of comprehension of an embodiment of the present invention, some introductory terms are explained.

a) "sensor" refers to a magnetic sensor such as a giant magneto-resistance (GMR), an anisotropic magneto-resistance (AMR), a planar Hall resistance (PHR) in a magnetic thin film, a giant magneto-impedance (GMI) and a Hall effect sensor in a semiconductor.

b) "magnetic label" refers to a super-paramagnetic bead or a simple magnetic particle.

c) "soft magnetic material" refers to a material of a single or multilayer structure having characteristics of relatively high magnetic permeability and relatively low coercivity.

Figure 2:
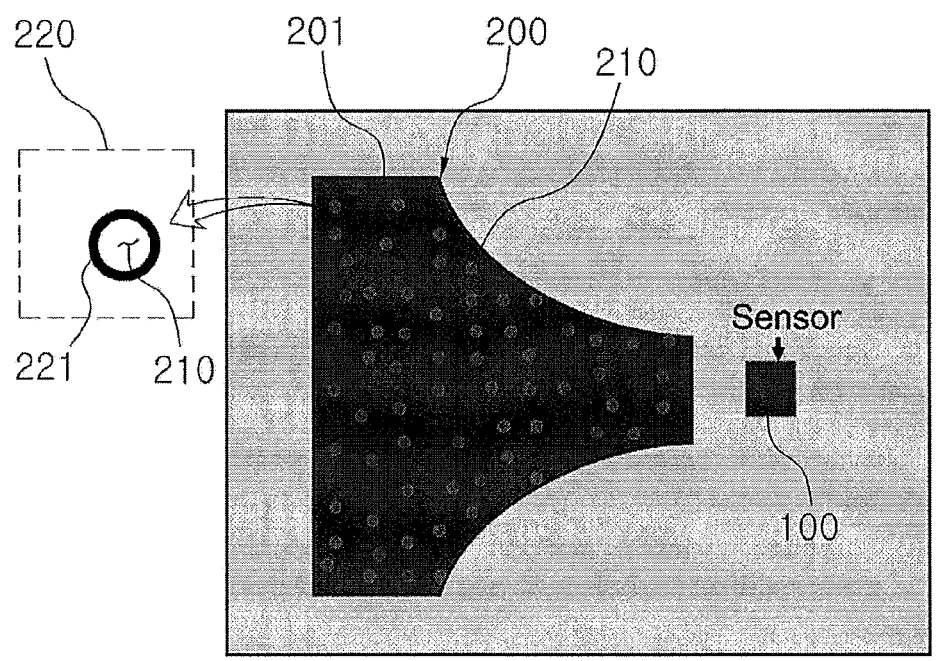
FIG. 2 is a plan view showing a bio-molecule sensing module including a single SFC pad, which is also called as an active region, and a sensor in accordance with an embodiment of the present invention.
Figure 3:
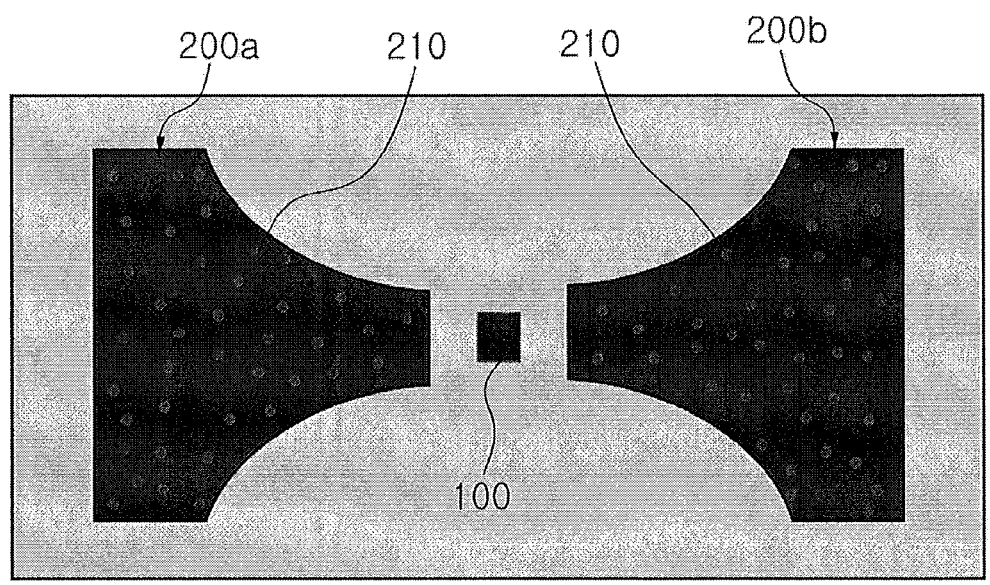
FIG. 3 is a plan view showing a bio-molecule sensing module including a dual SFC pad, which is also called as an active region, and a sensor in accordance with another embodiment of the present invention.

The concept of the SPC pad is illustrated in FIGS. 2 and 3. FIG. 2 is a plan view showing a bio-molecule sensing module including a single SFC pad, which is also called as an active region, and a sensor in accordance with an embodiment of the present invention, and FIG. 3 is a plan view showing a bio-molecule sensing module including a dual SFC pad, which is also called as an active region, and a sensor in accordance with another embodiment of the present invention.

Referring first to FIG. 2, the bio-molecule sensing module includes a SFC pad 200 and a biochip magnetic sensor 100 which is disposed alignedly with the SFC pad with a predetermined gap. The active region of the SFC pad 200 is formed widely and has a characteristic that its width is narrowed as goes toward the pad so as to collect the stray field. In the SFC pad, a plurality of the magnetic labels 210 remaining by probe-detection bio-molecular bond causes the stray field in the sensing active region 201. The magnetic label 210 is attached with the probe-detection bio-molecules 221 as shown in the partial sectional view of the left.

Although the magnetic labels 210 are arranged in random in FIG. 2, the present invention is not limited thereto and the magnetic labels 210 can be arranged with regularities.

In FIG. 3, a SFC pad 200a and another SFC pad 200b are alignedly disposed with a predetermined gap from each other and a biochip magnetic sensor 100 is disposed between the SFC pads 200a, 220b alignedly with the SFC pads 200a, 220b.

An array type biochip can immobilize the detection molecules on the active region of the SFC pads 200, 200a, 200b and hybridize the detection molecules with the magnetic label through the probe target molecules. Here, it is possible to increase the number of the magnetic labels depending on the size of the SFC pads 200, 200a, 200b.

When an areal density of the magnetic labels relative to the area of the sensor 100 is assumed to be equal, the total number of the magnetic labels on the SFC pad 200 is proportional to the ratio of the SFC pad 200 and the area of the sensor 100. The plate 201 of the SFC pad (200 of FIG. 2) can be made of a soft magnetic material.

In another embodiment, the SFC pad (201 of FIG. 2) can include a soft ferromagnetic material of a single or multilayer structure. The SFC pad 200, 200a, 200b including the active region 201 drives the magnetic flux to the sensor 100 and increases the magnetic flux density of the stray field applied on the sensor.

Figure 4A:
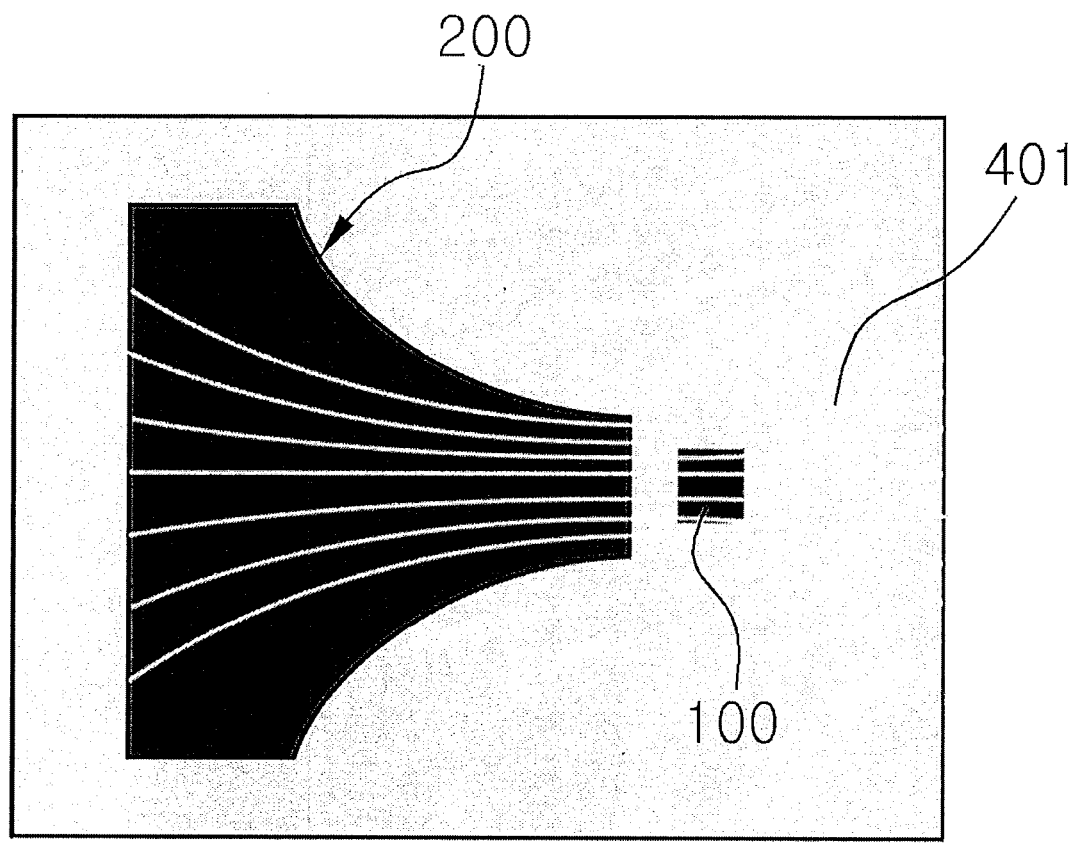
FIG. 4A is a schematic diagram of magnetic flux lines on a single SFC pad provided with a magnetic sensor in accordance with an embodiment of the present invention and FIG. 4B is a graph showing ideal stray field amplification curve by the single collector pad.
Figure 4B:
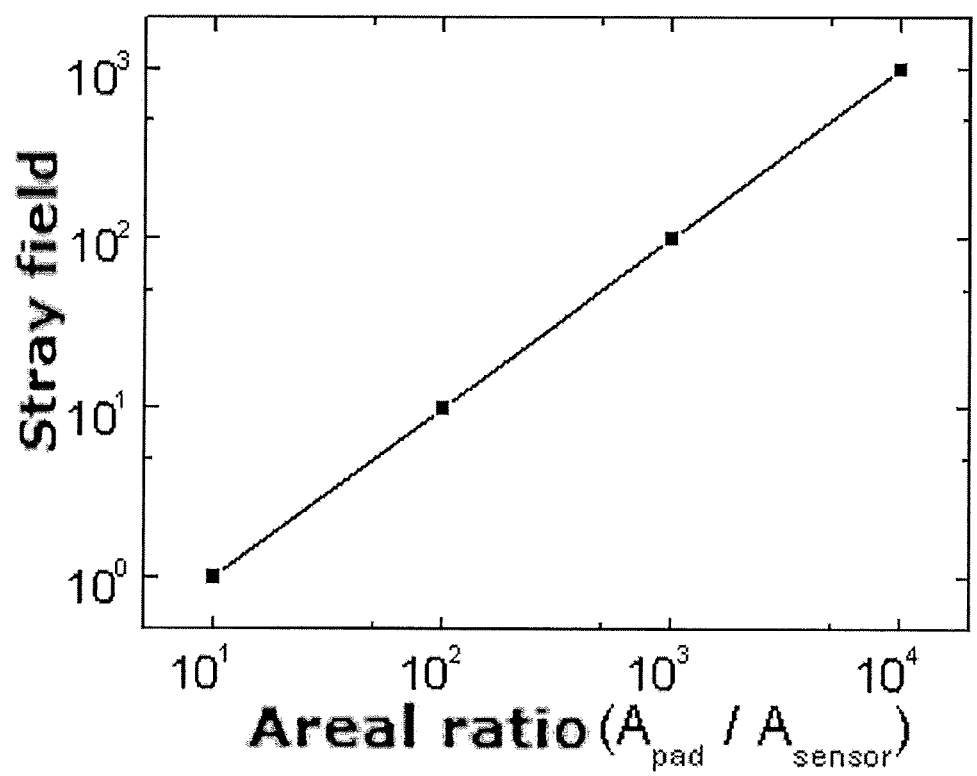
Figure 5A:
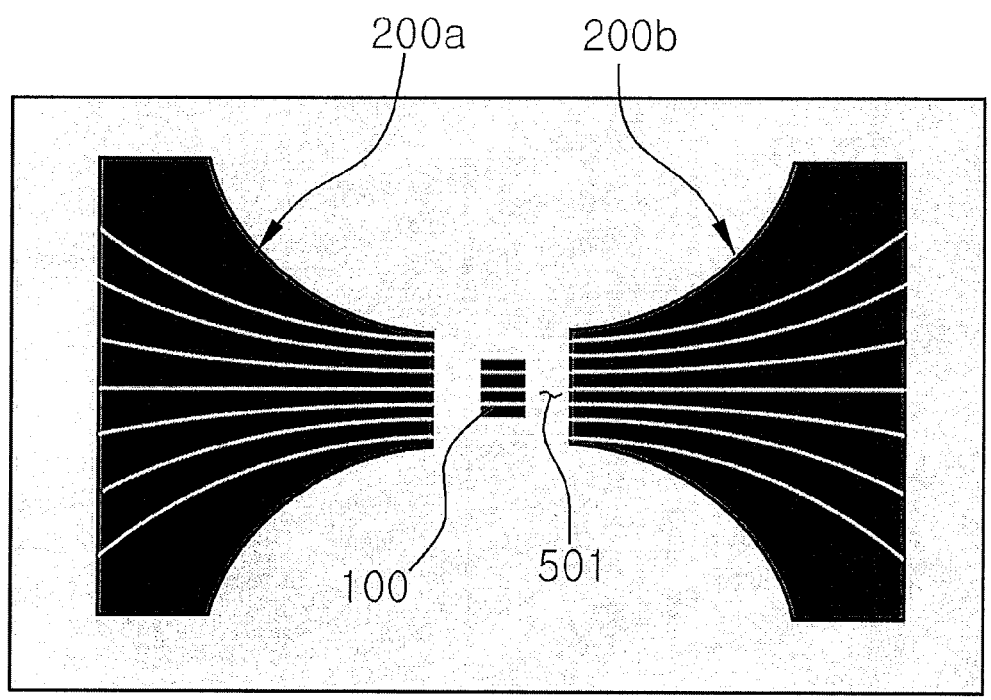
FIG. 5A is a schematic diagram of magnetic flux lines on a dual SFC pad provided with a magnetic sensor in accordance with another embodiment of the present invention and FIG. 5B is a graph showing ideal stray field amplification curve by the dual collector pad.
Figure 5B:
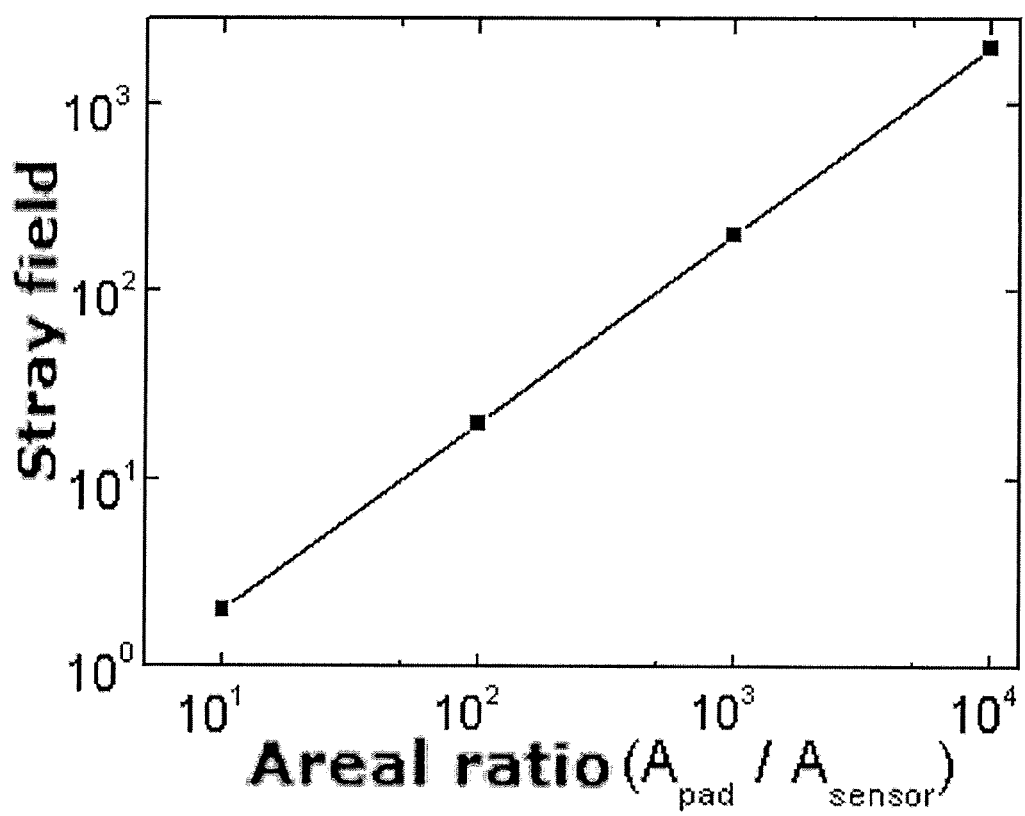

Also, ideal stray field amplification by the SFC pad 200, 200a, 200b is proportional to a relative area of $A_{pad}/A_{sensor}$, and this result in enhancement of a signal voltage. These are illustrated in FIGS. 4 and 5. Here, $A_{pad}$ is the area of the SFC pad 200, 200a, 200b and $A_{sensor}$ is the area of the biochip sensor 100.

FIG. 4 is a schematic diagram 400 of magnetic flux lines on a single SFC pad provided with a magnetic sensor in accordance with an embodiment of the present invention and a graph 410 showing ideal stray field amplification curve by the single collector pad, and FIG. 5 is a schematic diagram 500 of magnetic flux lines on a dual SFC pad provided with a magnetic sensor in accordance with another embodiment of the present invention and a graph 510 showing ideal stray field amplification curve by the dual collector pad.

As illustrated in FIGS. 4 and 5, when the external field $H_{app}$ is applied, the SFC pad 200, 200a, 200b drives the stray field (yellow lines) to the sensor 100 and as the result the flux density 401, 501 continuously increases on the sensing region (i.e. the region in the vicinity of the sensor 100).

Therefore, the stray field generated in the two SFC pads 200a, 200b shown in FIG. 5 is larger than that generated in the single SFC pad 200 shown in FIG. 4, and the magnitude of the stray field generated in the two SFC pads 200a, 200b is two times the magnitude of the stray field generated in the single SFC pad 200. That is, the graph 510 in FIG. 5 has a slope sharper than that of the graph 410 in FIG. 4.

This is because the SFC pads 200, 200a, 200b not only amplify the magnetic flux density but also function as stray filed collector (SFC) and amplifier on the sensor, depending on the permeability, geometries and relative areas of the SFC pads 200, 200a, 200b.

Also, the amplification depends on the gap between the SEC pad 200, 200a, 200b and the sensor 100, but the amplification is the same for both the external field and the stray field. Therefore, the flux density of the applied field and the stray field are, respectively, approximated as following equations:

$$B_{eff} = B_o - B_{stray} \quad \text{[Mathematical Equation 2]}$$

$$B_o = f(\mu) H_{app} \quad \text{[Mathematical Equation 3]}$$

$$B_{stray} = f(\mu) H_{stray1} N$$

$$\propto f(\mu) H_{stray1} A_{pad}/A_{sensor} \quad \text{[Mathematical Equation 4]}$$

where, $\mu$ is the permeability, and $f(\mu)$ is the amplification factor of the magnetic field, depending on geometry and permeability of the pad. N is the number of the magnetic labels 210 on the active regions 200, 200a, 200b. Also, $H_{stray1}$ herein is the stray field generated by a single magnetic label 210.

By comparing the mathematical equations 3 and 4, the stray field by the collector pad is amplified by the factor of $A_{pad}/A_{sensor} \times f(\mu)$, wherein the flux density $B_o$ of the applied field is amplified by just $f(\mu)$.

It is possible to estimate stray field of magnetic labels 210 by using the last part of mathematical equation 1 without the SFC pad. For example, the stray field of a single magnetic label of 2.8 μm diameter with 3 μm×3 μm sensor is typically 0.4 Oe under external field 20 Oe, which is less than the saturation field of the magnetic sensor.

In this sensor, as shown in FIG. 5, the single magnetic label 210 of 2.8 μm size causes variation in the signal voltage.

For example, with the active region pad, i.e. using the SFC pad 200, 200a, 200b of 300 μm×300 μm, total number of the labels could be order of $10^5$. With respect to the magnetic flux density of the applied field, it is necessary to optimize the sensor with higher saturation field by factor of $f(\mu)$, causing less field sensitivity (curve slope) by $1/f(\mu)$.

Since the collector pad 200, 200a, 200b causes the field amplification by the factor of $f(\mu)$, application of the external field $H_{app}$ will induce the same signal voltage as that of the sensor without pad. However, since the number of the labels on the active region is order of $10^5$, the stray field causes the signal 614 amplified by $f(\mu) \times 10^5$ times as schematically depicted in FIG. 6.

Figure 6:
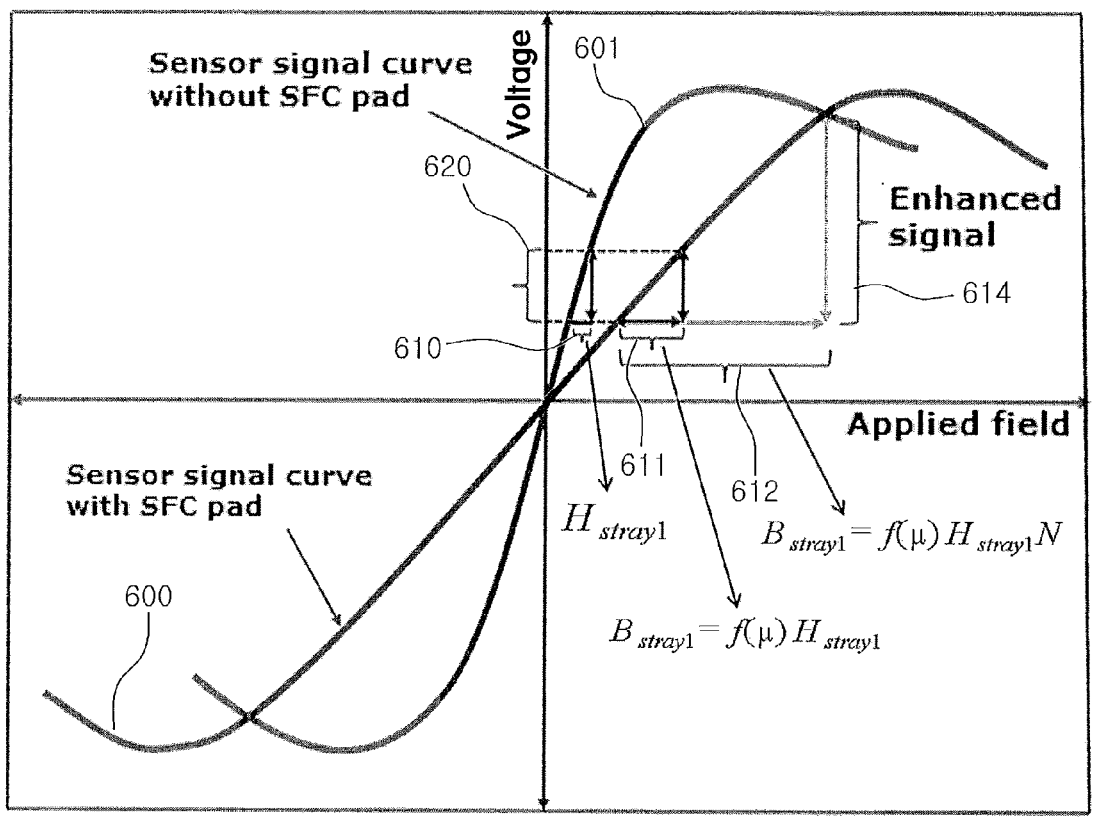
FIG. 6 is a graph of a signal voltage by a stray field of a single label without a collector pad in accordance with the present invention and a graph of a signal voltage amplified by a stray field of a single label with a collector pad.

FIG. 6 is a graph of a signal voltage by a stray field of a single label without a collector pad in accordance with the present invention a graph of a signal voltage amplified by a stray field of a single label with a collector pad.

FIG. 6 shows a signal curve 600 with the SFC pad 200, 200a, 200b and a signal curve 601 without the SFC pad, respectively.

More specifically, without the SFC pad 200, 200a, 200b, the stray field 610 and sensed voltage signal 620 are shown.

To the contrary, with the SFC pad, a single stray field amplification 611 and a sensed voltage signal 620 are shown. Since the labels of the order of $10^5$ cause the stray field in the active region, total field amplification 612 and the resultant variation 622 in the voltage signal are generated.

Therefore, with the SFC pad 200, 200a, 200b, it is possible to obtain the enhancement of more or less $10^5$ times higher signal voltage, depending on the modification for the stray field distribution.

While the present invention has been described with respect to the specific embodiments, it will be apparent to those skilled in the art that various changes and modifications may be made without departing from the spirit and scope of the invention as defined in the following claims.

What is claimed is:

1. A bio-molecule sensing module, comprising:
   a stray field collector (SFC) pad which has a large active region for sensing bio-molecules, is made of a soft magnetic material or a soft ferromagnetic material of a single or multilayer structure capable of collecting a stray field, and has a shape in which a width of a side thereof is narrowed so that the stray field generated from a magnetic label on the active region is collected to amplify a magnetic flux density, and a biochip sensor which is disposed alignedly with the side of the stray field collector pad having the narrowed width, having a predetermined gap therebetween and receives the stray field collected through the side of the stray field collector pad to sense the magnetic flux density, wherein the stray field is amplified by the following mathematical equation:

$$B_{stray} = f(\mu) H_{stray1} N$$

$$\propto f(\mu) H_{stray1}{}^{Apad/Asensor}$$

where, $\mu$ is a permeability, and $f(\mu)$ is an amplification factor of the magnetic field depending on geometry and permeability of the SFC pad, N is a number of the magnetic labels on the SFC pad, $H_{stray1}$ is the stray field made by a single magnetic label, $A_{pad}$ is an area of the SFC pad, and $A_{sensor}$ is an area of the biochip sensor, wherein the stray field collector pad collects and amplifies the stray field on the biochip sensor.

2. The bio-molecule sensing module of claim 1, wherein the bio-molecule sensing module comprises one SFC pad which is disposed longitudinally or laterally with a predetermined gap from the biochip sensor, or two SFC pads which are disposed longitudinally or laterally with a predetermined gap from the biochip sensor with the biochip sensor therebetween.

3. The bio-molecule sensing module of claim 2, wherein the biochip magnetic sensor is any one of a giant magneto-resistance (GMR), an anisotropic magneto-resistance (AMR), a planar Hall resistance (PHR) in a magnetic thin film, a giant magneto-impedance (GMI) and a Hall effect sensor in a semiconductor.

4. The bio-molecule sensing module of claim 2, wherein the magnetic flux density depends on the gap between the SFC pad and the biochip magnetic sensor.

5. The bio-molecule sensing module of claim 2, wherein the SFC pad drives the magnetic flux to the biochip sensor and increases the magnetic flux density of an external field applied on the biochip magnetic sensor.

6. The bio-molecule sensing module of claim 2, wherein the bio-molecule sensing module is any one of a membrane strip module, a biosensor module sensing the stray field by an array method and a biosensor module sensing the stray field by a channel method.

* * * * *